(12) United States Patent
Dutta

(10) Patent No.: US 7,811,918 B1
(45) Date of Patent: Oct. 12, 2010

(54) ELECTRIC CURRENT INDUCED LIQUID METAL FLOW AND METALLIC CONFORMAL COATING OF CONDUCTIVE TEMPLATES

(75) Inventor: Indranath Dutta, Pullman, WA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 38 days.

(21) Appl. No.: 12/351,614

(22) Filed: Jan. 9, 2009

(51) Int. Cl.
*H01L 21/20* (2006.01)

(52) U.S. Cl. .............. 438/584; 438/674; 438/678; 205/80; 205/96; 205/123; 257/E21.498

(58) Field of Classification Search .......... 438/584, 438/674, 678; 205/80, 96, 118, 123, 147, 205/157
See application file for complete search history.

(56) References Cited

U.S. PATENT DOCUMENTS

| | | | |
|---|---|---|---|
| 3,991,396 | A | 11/1976 | Barkan |
| 4,712,032 | A | 12/1987 | Hatch |
| 6,077,571 | A | 6/2000 | Kaloyeros et al. |
| 6,576,488 | B2 | 6/2003 | Collins, III et al. |
| 6,965,071 | B2 | 11/2005 | Watchko et al. |
| 7,214,889 | B2 | 5/2007 | Mazurkiewicz |
| 2004/0134682 | A1 * | 7/2004 | En et al. ............ 174/258 |

OTHER PUBLICATIONS

Anthony, T.R. "The Electromigration of Liquid Metal Inclusions in Si". J. Appl. Phys 51(12), Dec. 1980, pp. 6356-6365.

Epstein, Seymour G. "Electromigration of a Series of Solutes in Liquid Bismuth". Conference on the Properties of Liquid Metals, 1967, pp. 325-332.

Green, N.G., Ramos, A., Gonzalez, A., Morgan, H. and Castellanos, A. "Fluid Flow Induced by Nonuniform AC Electric Fields in Electrolytes on Microelectrodes". Physical Review E., vol. 61, No. 4, Apr. 2000, pp. 4011-4018.

Ji, L., Kim, J.-K., Ji, Q., Leung, K.-N., Chen, Y., and Gough, R.A. "Conformal Metal Thin-film Coatings in High-aspect-ratio Trenches Using a Self-sputtered RF-drived Plasma Source". J. Vac. Sci. Technol. B 25(4), Jul./Aug. 2007, pp. 1227-1230.

Olvera de la Cruz, M., Deutsch, J.M., and Edwards, S.F. "Electrophoresis in Strong Fields". Physical Review A, vol. 33, No. 3, Mar. 1986, pp. 2047-2055.

(Continued)

*Primary Examiner*—Hsien-ming Lee
(74) *Attorney, Agent, or Firm*—Donald E. Lincoln; Lisa A. Norris

(57) ABSTRACT

A conformal metallic layer is applied to a selected region of a substrate by forming a pattern of electrically conductive lines on the substrate, placing a bead of a selected metal on the substrate at an edge of the region selected for coating, and passing an electric current through the bead and through conductive lines that extend over the region of the substrate selected for coating with the electric current having a current density sufficient to melt the bead so that metallic material therefrom flows over the conductive lines to form the coating. A pair of electrically conductive connectors is placed in contact with the electrically conductive lines, and an electric power supply is connected to the pair of electrically conductive connectors such that electric current passes through the bead, melts the bead to form a liquid metal, and carries the liquid metal in a continuous stream along the conductive lines, coating the conductive lines conformally in the process.

7 Claims, 2 Drawing Sheets

OTHER PUBLICATIONS

Quilliet, Catherine, and Berge, B. "Electrowetting; a Recent Outbreak". Current Opinion in Colloid and Interface Science 6 (2001), pp. 34-39.

Regan, B.C., Aloni, S., Ritchie, R.O., Dahmen, U., and Zettl, A. "Carbon Nanotubes as Nanoscale Mass Conveyors". Nature, vol. 428. Apr. 29, 2005, pp. 924-927.

* cited by examiner

ELECTRIC CURRENT INDUCED LIQUID METAL FLOW AND METALLIC CONFORMAL COATING OF CONDUCTIVE TEMPLATES

BACKGROUND OF THE INVENTION

1. Field of the Invention

This invention relates to applying a conformal metal coating to an electronic circuit component.

2. Description of the Related Art

Metallic thin film conformal coatings are used in a variety of micro-system components for environmental protection, thermal management, prevention of electrostatic discharge, and electromagnetic and radio frequency interference shielding. In many applications, the conformal coating needs to be applied only to the metallic electrical circuitry that is patterned on to a semiconductor or insulator substrate (e.g., in microelectronics). However, common methods for applying conformal coatings, such as dipping in liquid or vapor/spray deposition coat the entire component indiscriminately, thereby producing short-circuits between the patterns. As a result, these techniques are unsuitable for selectively depositing a metal coating on patterned circuitry, unless a patterned mask or an insulating layer is first applied to prevent coating of the regions between the circuits. To date, there is no straightforward methodology for mask-less deposition of a conformal metallic coating on patterned circuitry on a chip.

While electric fields can be utilized to induce long-range flow of liquid electrolytes (electrophoresis or electro-osmosis), short-range wicking of liquid metals (electro-wetting), motion of discrete liquid metal inclusions embedded in solids, or surface transport of matter between discrete droplets of liquid metals, long-range continuous flow of liquid metal streams due to an electric field has never been reported or utilized before.

SUMMARY OF THE INVENTION

Embodiments in accordance with the invention utilize an electric current flowing through a conductive pattern on an otherwise non-conducting substrate to induce long-range continuous flow of a thin liquid metal stream on the conductive pattern, and thereby produce a coating of controllable thickness on the conductive pattern. Electrically induced non-metallic conformal coatings have been generated on conductive structures via electrophoretic transport. Liquid metals have also been pumped or circulated electrically utilizing viscous body forces or electromagnetic body forces (where flow is normal to the current path). But metallic conformal coatings have never been produced via liquid metal flow driven by and along an electric current.

Embodiments in accordance with the invention exploit the phenomenon of electromigration within a pure liquid metal to produce bulk liquid metal flow, which has never been done before. Electromigration is the transport of material caused by the gradual movement (diffusion) of the atoms or ions in a metallic conductor due to momentum transfer between conducting electrons and metal atoms. The effect is important in applications where high direct current densities are used, such as in microelectronics and related structures. In addition to enabling new coating technologies, embodiments in accordance with the invention show that an electric current can be used to make a liquid metal flow in a controllable fashion, and can engender an array of new, ingenious applications in lithography, fabrication and micro-fluidics.

Embodiments in accordance with the invention provide a novel method to produce controllable, long range, continuous flow of a liquid metal stream due to the application of an electric current. Embodiments in accordance with the invention further provide application of the method to produce conformal metallic coatings on electrically conductive features on selected portions of an otherwise non-conductive substrate. At present, there is no known method for making a stream of liquid metal flow continuously on a conductive substrate by applying an electric current. Furthermore, there is no known method for selectively applying a metal coating on patterned circuitry (e.g., on a micro-chip) without producing short-circuits unless a patterned mask is applied first. Embodiments in accordance with the invention utilizes the new method of electrically inducing flow of liquid metals to produce mask-less conformal metallic coatings on only the conductive patterns on a substrate (e.g., circuitry on a chip).

Accordingly, a method according to the present invention for applying a conformal metallic layer to a selected region of a substrate includes: forming a pattern of electrically conductive lines on the substrate, placing a bead of a selected metal on the substrate at an edge of the region selected for coating, and passing an electric current through the bead and through conductive lines that extend over the region of the substrate selected for coating with the electric current having a current density sufficient to melt the bead so that metallic material therefrom flows over the conductive lines to form the coating.

In some embodiments, the method further includes placing a pair of electrically conductive connectors in contact with the electrically conductive lines and connecting an electric power supply to the pair of electrically conductive connectors such that electric current passes through the bead.

In addition to conformal coating, the method of electrically induced continuous flow of liquid metal in accordance with the invention is applicable to processes which require controllable flow of a liquid metal stream along any kind of conductive conveyor (e.g., wires, styluses, channels, patterned surface circuitry, etc.) of nanometer to micrometer scale.

Embodiments in accordance with the invention are best understood by reference to the following detailed description when read in conjunction with the accompanying drawings.

DETAILED DESCRIPTION OF THE INVENTION

Figure 1:
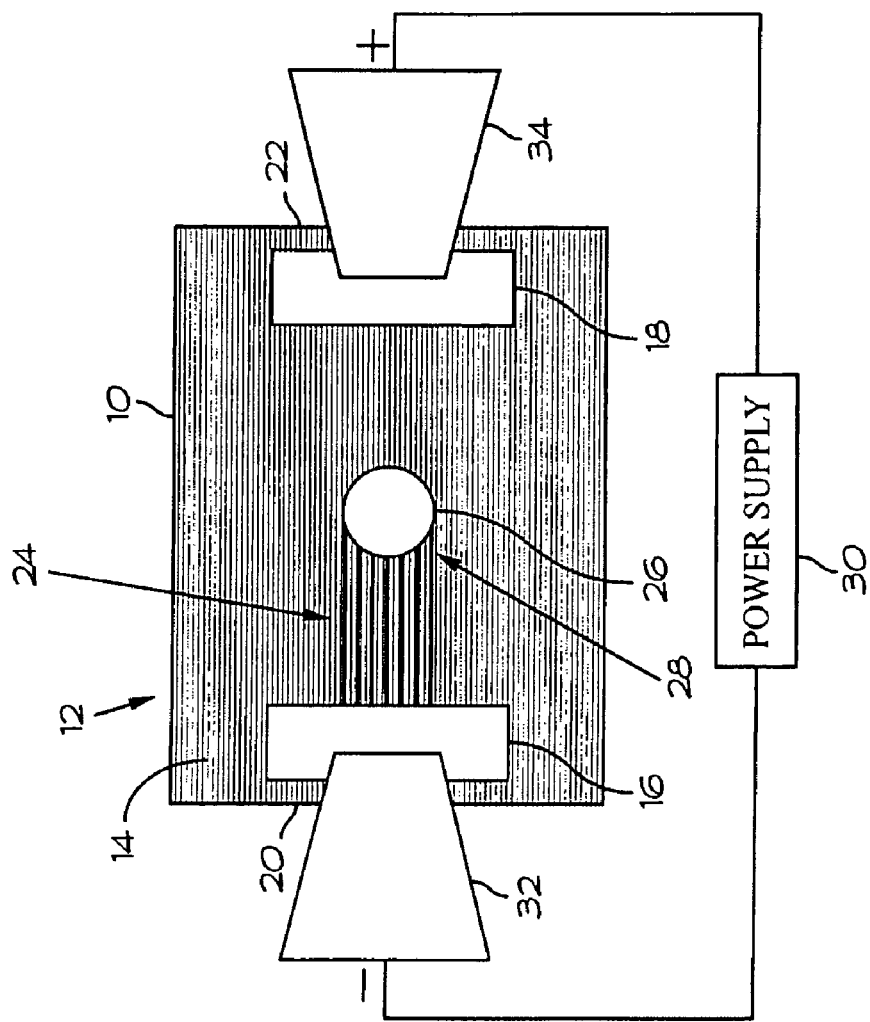
FIG. 1 is a plan view showing mask-less application of a low melting point metallic coating material on a substrate having a plurality of conductive lines thereon in accordance with one embodiment.

Referring initially to FIG. 1, in one embodiment, a substrate 10 formed of a nominally non-conductive material such as a semiconductor or ceramic chip has a pattern of electrically conductive lines 12 formed on a surface 14 thereof. The conductive patterned features may be either deposited on the surface 14 (as in thin film metal lines or circuitry), or carved into the surface 14 (as in the form of micro-channels coated with a conductive film). The material used to form the patterned features (lines, circuitry or film) may be any suitable electrical conductor. The pattern of the conductive lines can be simple parallel lines as shown in FIG. 1 for convenience in describing the invention or very complex with numerous twists and turns.

A pair of silver electrical connectors 16 and 18 is formed near opposite sides 20 and 22, respectively, of the substrate 10. The silver electrical connectors 20 and 22 extend across conductive lines 12 that are to be coated with a low melting point metal in accordance with method 200.

Figure 2:
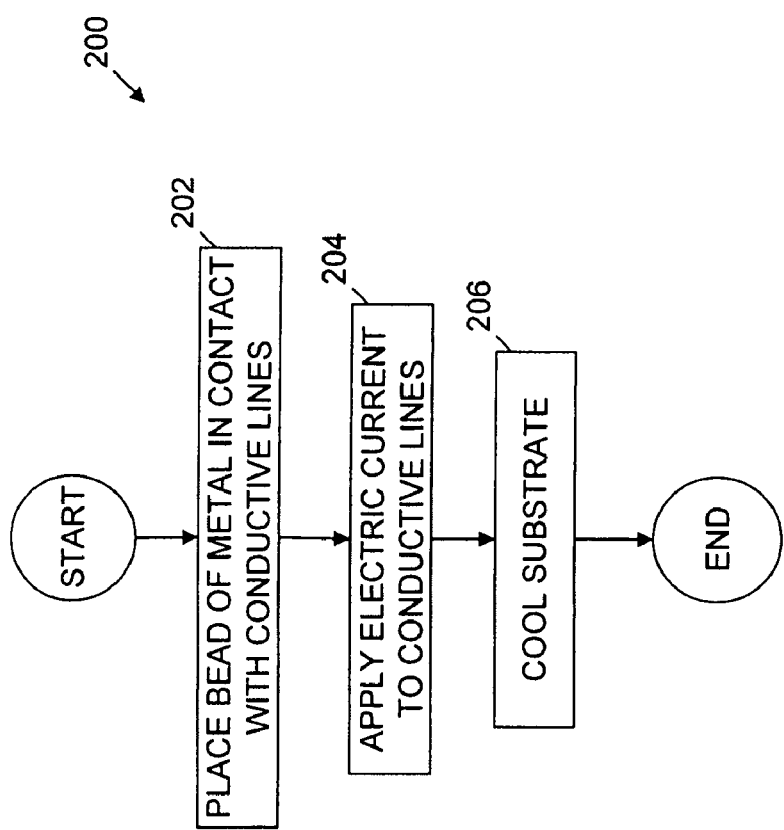
FIG. 2 is a process flow diagram of a method for mask-less application of a conformal metallic coating on a conductive substrate in accordance with one embodiment.

In the present embodiment, the entire set up of FIG. 1 and method 200 is performed within a vacuum system or within a suitable protective gaseous environment. Referring now to FIGS. 1 and 2 together, in accordance with one embodiment, method 200 is entered at a PLACE BEAD OF METAL IN CONTACT WITH CONDUCTIVE LINES operation 202.

In PLACE BEAD OF METAL IN CONTACT WITH CONDUCTIVE LINES operation 202, a metal bead 26 or reservoir of a low melting point metal that is to be used to coat the patterned structure is placed on or in contact with the circuit pattern formed by one or more electrically conductive lines 12. Bead 26 preferably is located at an edge 28 of region 24 to be coated and is located between electrical connectors 16 and 18. From PLACE BEAD OF METAL IN CONTACT WITH CONDUCTIVE LINES operation 202, processing transitions to an APPLY ELECTRIC CURRENT TO CONDUCTIVE LINES operation 204.

In APPLY ELECTRIC CURRENT TO CONDUCTIVE LINES operation 204, an electric current with a high current density is made to flow from a power supply 30 through the patterned circuitry of conductive lines via copper clips 32 and 34 attached at appropriate locations to electrical connectors 16 and 18. The current density and the duration of current flow are determined by the desired thickness of the coating, the coating material, and the rate of the coating. The applied electric current causes Joule heating of the circuitry in the circuit pattern resulting in localized melting of metal bead 26. The liquefied metal of bead 26 continuously flows along the patterned template constituted by the circuit pattern and forms a conformal coating 30 on the circuit pattern of region 24. From APPLY ELECTRIC CURRENT TO CONDUCTIVE LINES operation 204, processing transitions to a COOL SUBSTRATE operation 206.

In COOL SUBSTRATE operation 206, after the conformal coating of operation 204 is finished continuously flowing along the patterned circuit of region 24, in one embodiment, substrate 10 is left in the vacuum system or other suitable protective gaseous environment until the temperature of substrate 10 and the freshly applied conformal coating 30 are close to room temperature. This prevents oxidation and other environmentally induced deterioration of newly formed conformal coating 30 during cooling. From COOL SUBSTRATE operation 206, processing exits method 200.

The mechanism or phenomenon exploited to effect this liquid flow is electromigration in a liquid metal. The liquid flow direction is generally from the positive terminal to the negative terminal (i.e., along the direction of the current), although for some coating materials, the flow direction may be opposite to that of current flow. The direction of flow depends on the competition between component forces for electromigration (electrostatic and wind forces).

Notable of embodiments in accordance with the invention is that a liquid metal can be made to flow in a continuous stream of controllable thickness along a template (an electrically conductive path which may have a simple or a complex pattern) by applying an electric current. Embodiments in accordance with the invention are specific to the movement/flow of metallic liquids (pure or alloy) on an electrically conductive substrate/template of any shape, through which an electric current is passing, and which is in electrical contact with the source of the liquid metal.

Also notable of embodiments in accordance with the invention is that using electrically induced liquid metal flow, the conductive template or pattern can be conformally coated by a metal. Importantly, the coating is produced only on the conductive, current-carrying features of the sample, leaving the non-conductive features uncoated. Conformal coating is defined as a coating covering all exposed surfaces of a pattern.

Further notable is that the principles of the invention are applicable to a variety of embodiments, depending on the type of vehicle or template that is used as a substrate for flow or delivery of the liquid metal. Some examples of the vehicle or template used to deliver the liquid metal are: (i) a patterned or unpatterned surface film, (ii) a stylus, (iii) vias (or orifices or capillaries) in a solid body, (iv) a wire/fiber/whisker, (v) channels machined into the surface of a substrate, or (vi) channels carved partly or entirely inside a solid body. In one embodiment, the surface vehicle or template (which is in contact with the liquid) must be electrically conductive. The size-scale of these vehicles or templates of liquid flow/delivery (e.g., line-width, whisker-diameter, channel-depth, etc) can range from a nanometer to several millimeters.

The thickness of the liquid flow stream can be controlled to be from a few nanometers to hundreds of micrometers. One way to achieve this is by controlling the advance velocity of the melt-front, which in turn can be changed by adjusting the chemistry of the liquid surface and chemical interaction between the substrate surface and the flowing liquid metal.

The distance over which the liquid can be made to flow can range from a few nanometers to many centimeters. A transition from liquid flow in a continuous stream to mass transport between discrete liquid droplets via atomic diffusion along the surface of the substrate may be obtained by mechanically or chemically adjusting the substrate surface condition to alter wetting at the solid-liquid interface.

A reversal of the current direction reverses the flow, thereby removing part or all of the coating, particularly when there is no significant solubility or reaction between the coating and substrate materials. By reversing the current, a thicker coating may be thinned, or an initially bumpy coating may be smoothed.

The liquid flow process is independent of the orientation of the patterned substrate 10 relative to the ground (e.g. vertical, horizontal, upside down, right side up, etc), indicating that gravity or pressure difference plays no (or negligible) role in the flow. Electromigration enables atoms of the liquid to diffuse under the influence of the applied electric field. Since there are two competing forces acting in opposite directions during electromigration, the net flow of the liquid may be either for or against the applied current, depending on the specific coating material.

Embodiments in accordance with the invention have applications in many technological arenas (e.g., coatings, lithography, micro/nanofluidics), and in many industries (e.g., electronics, semiconductor, micro-electro-mechanical systems, mechanotronics, avionics, etc.), wherever controllable delivery of a continuous stream of liquid metal is required.

What is claimed is:

1. A method for forming a conformal metallic layer on a selected region of a substrate, comprising:
   forming a pattern of electrically conductive lines on the substrate;
   placing a bead of a selected metal on the substrate at an edge of the region selected for coating with a conformal metallic layer;
   placing a pair of electrically conductive connectors in contact with the electrically conductive lines; and passing an electric current through the bead and through the conductive lines that extend over the region of the substrate selected for coating with the electric current having a current density sufficient to melt the bead so that metallic material therefrom flows over the conductive lines to form the coating of the conformal metallic layer.

2. The method of claim 1 further comprising:

connecting an electric power supply to the pair of electrically conductive connectors such that electric current passes through the bead.

3. The method of claim 1 wherein forming a pattern of electrically conductive lines on the substrate comprises:

applying a plurality of conductive wires to the substrate.

4. The method of claim 1 wherein forming a pattern of electrically conductive lines on the substrate comprises:

applying a plurality of conductive fibers to the substrate.

5. The method of claim 1 wherein forming a pattern of electrically conductive lines on the substrate comprises:

applying a plurality of conductive whiskers to the substrate.

6. The method of claim 1 wherein forming a pattern of electrically conductive lines on the substrate comprises:

forming a plurality of vias in the substrate; and placing a conductive material in the vias.

7. The method of claim 1 wherein forming a pattern of electrically conductive lines on the substrate comprises:

forming a plurality of channels in the substrate; and placing a conductive material in the channels.

* * * * *